United States Patent
Liu et al.

(10) Patent No.: US 8,963,900 B2
(45) Date of Patent: Feb. 24, 2015

(54) BIDIRECTIONAL SCANNING DRIVING CIRCUIT

(71) Applicants: Giantplus Technology Co., Ltd., Miao-Li County (TW); National Chiao Tung University, Hsinchu (TW)

(72) Inventors: Po-Tsun Liu, Miao-Li County (TW); Li-Wei Chu, Miao-Li County (TW); Guang-Ting Zheng, Miao-Li County (TW); Chun-Yen Chen, Miao-Li County (TW); Yi-Chun Kuo, Miao-Li County (TW); Kai-Ju Chou, Miao-Li County (TW); Che-Yao Wu, Miao-Li County (TW); Po-Chun Huang, Miao-Li County (TW); Ku-Huang Lai, Miao-Li County (TW)

(73) Assignees: Giantplus Technology Co., Ltd., Miao-Li Country (TW); National Chiao Tung University, Hsinchu Country (TW)

( * ) Notice: Subject to any disclaimer, the term of this patent is extended or adjusted under 35 U.S.C. 154(b) by 144 days.

(21) Appl. No.: 13/836,403

(22) Filed: Mar. 15, 2013

(65) Prior Publication Data
US 2014/0062979 A1     Mar. 6, 2014

(30) Foreign Application Priority Data
Aug. 29, 2012   (TW) .............................. 101131434 A (51) Int. Cl.
G09G 3/36      (2006.01)
G11C 19/18     (2006.01)
G11C 19/28     (2006.01)

(52) U.S. Cl.
CPC ................ *G09G 3/36* (2013.01); *G09G 3/3677* (2013.01); *G09G 2300/0413* (2013.01); *G09G 2310/0283* (2013.01); *G11C 19/184* (2013.01); *G11C 19/28* (2013.01)
USPC .......................................... 345/204; 345/100

(58) Field of Classification Search
CPC . G09G 3/3611; G09G 3/3618; G09G 3/3625; G09G 3/3648; G09G 3/3655; G09G 3/3659; G09G 3/3674; G09G 2310/0286; G09G 2310/0202; G09G 2310/0267; G09G 2310/0281; G09G 2310/0283
USPC ................................. 345/204, 205, 206, 100
See application file for complete search history.

(56) References Cited

U.S. PATENT DOCUMENTS

| | | | |
|---|---|---|---|
| 2010/0259530 A1 | 10/2010 | Chang et al. | |
| 2010/0315387 A1 * | 12/2010 | Taniguchi | ..................... 345/204 |
| 2011/0175868 A1 * | 7/2011 | Minami et al. | ................ 345/205 |
| 2012/0075275 A1 * | 3/2012 | Chen et al. | ..................... 345/208 |

FOREIGN PATENT DOCUMENTS

TW     201037674 A     10/2010

* cited by examiner

*Primary Examiner* — Adam R Giesy
(74) *Attorney, Agent, or Firm* — Rosenberg, Klein & Lee (57) ABSTRACT

The invention provides a bidirectional scanning driving circuit, which comprises N stages of driving modules. Driving module comprises an output unit, a forward input unit, and a reverse input unit. For the n-th stage driving module, the forward input unit receives a first input voltage and a front forward scan signal of any of the driving modules lower than or equal to (n−2)th stage for charging or discharging a control node of the output unit. The reverse input unit receives a second input voltage and a back reverse scan signal of any of the driving modules higher than or equal to (n+2)th stage for charging or discharging the control node of the output unit. When the forward input unit is charging the output unit, the output unit outputs a forward scan signal; when the reverse input unit is charging the output unit, the output unit outputs a reverse scan signal.

10 Claims, 5 Drawing Sheets

BIDIRECTIONAL SCANNING DRIVING CIRCUIT

FIELD OF THE INVENTION

The present invention relates generally to a driving circuit, and particularly to a bidirectional scanning driving circuit.

BACKGROUND OF THE INVENTION

With the prosperous development of modern technologies, novel information products are introduced for satisfying people's various needs. Compared with conventional displays, liquid crystal displays (LCDs) have the advantages of light and compact size, low radiation, and low power consumption. Thereby, current conventional displays in the market have being replaced by LCDs gradually, making LCDs as a mainstream in the display market. No matter which type of LCDs, a driving circuit is required for driving the LCD panel. For a thin-film transistor (TFT) panel, a bidirectional scanning driving circuit is used for controlling if the pixel structure of the TFT receives the data signal provided by the data driving circuit. Thereby, the pixel electrode of the pixel structure can have the voltage corresponding to the data signal, and thus forming the electric field between the common electrode and the pixel electrode for driving the liquid crystals therebetween to rotate. In addition, the rotating angle of the liquid crystals can be adjusted by varying the intensity of the electric field. Because the bidirectional scanning driving circuit outputs scan signals to the gates of the TFTs for driving, the bidirectional scanning driving circuit can also be named as a gate driving circuit.

A conventional TFT-LCD panel is formed by attaching a TFT panel glass to a color filter glass and filling the gap therebetween with liquid crystal molecules. In order to reduce the number of devices as well as lowering the manufacturing cost, the trend is to fabricate the driving circuit structure on the display panel directly in recent years. For example, the gate on array (GOA) technology is to integrate the scanning driving circuit on the liquid crystal panel. This novel mass-production technology performs the color-filter process after completing the TFT array on the TFT panel glass. This technology can improve the aperture ratio of pixels and thus enhancing the brightness of the panel.

The scanning driving circuit is required to respond rapidly and have light and compact designs for LCD panels. In addition, for supporting bidirectional scanning, the influence among devices in the circuit should be reduced and the interference among signals should be minimized as well. Thereby, the layout of the control circuit for bidirectional scanning in the scanning driving circuit need to be simplified. The noise during charging and discharging should be canceled too.

Accordingly, the present invention provides a bidirectional scanning driving circuit, which simplifies the charging and discharging mechanisms and thus reducing the number of transistors required for bidirectional scanning. The present invention can also be applied to the GOA technology for disposing the driving circuit on a thin panel.

SUMMARY

An objective of the present invention is to provide a bidirectional scanning driving circuit, which provides the scan signal for bidirectional scanning.

Another objective of the present invention is to provide a bidirectional scanning driving circuit, which simplifies the driving circuit for reducing the circuit area.

Still another objective of the present invention is to provide a bidirectional scanning driving circuit, which provides a plurality of clock signals to the driving circuit for reducing the operating time of transistors and thus reducing the power consumption.

The present invention provides a bidirectional scanning driving circuit, which comprises N stages of driving modules. The plurality of driving modules receive a plurality of clock signals, a first input voltage and a second input voltage, respectively, and produce and output a plurality of scan signals to a display panel sequentially. Each of the plurality of driving modules comprises an output unit, a forward input unit, and a reverse input unit, respectively. The forward and reverse input units are coupled to the output unit. For the n-th stage driving module, the forward input unit receives the first input voltage and a front forward scan signal of any of the plurality of driving modules lower than or equal to (n−2)th stage. The forward input unit charges or discharges a control node of the output unit according to the first input voltage and the front forward scan signal. The reverse input unit receives the second input voltage and a back reverse scan signal of any of the plurality of driving modules higher than or equal to (n+2)th stage. The reverse input unit charges or discharges the control node of the output unit according to the second input voltage and the back reverse scan signal. The output unit receives a first clock signal of the plurality of clock signals. Thereby, when the forward input unit is charging the output unit, a forward scan signal is produced; when the reverse input unit is charging the output unit, a reverse scan signal is produced.

DETAILED DESCRIPTION

In order to make the structure and characteristics as well as the effectiveness of the present invention to be further understood and recognized, the detailed description of the present invention is provided as follows along with embodiments and accompanying figures.

Figure 1A:
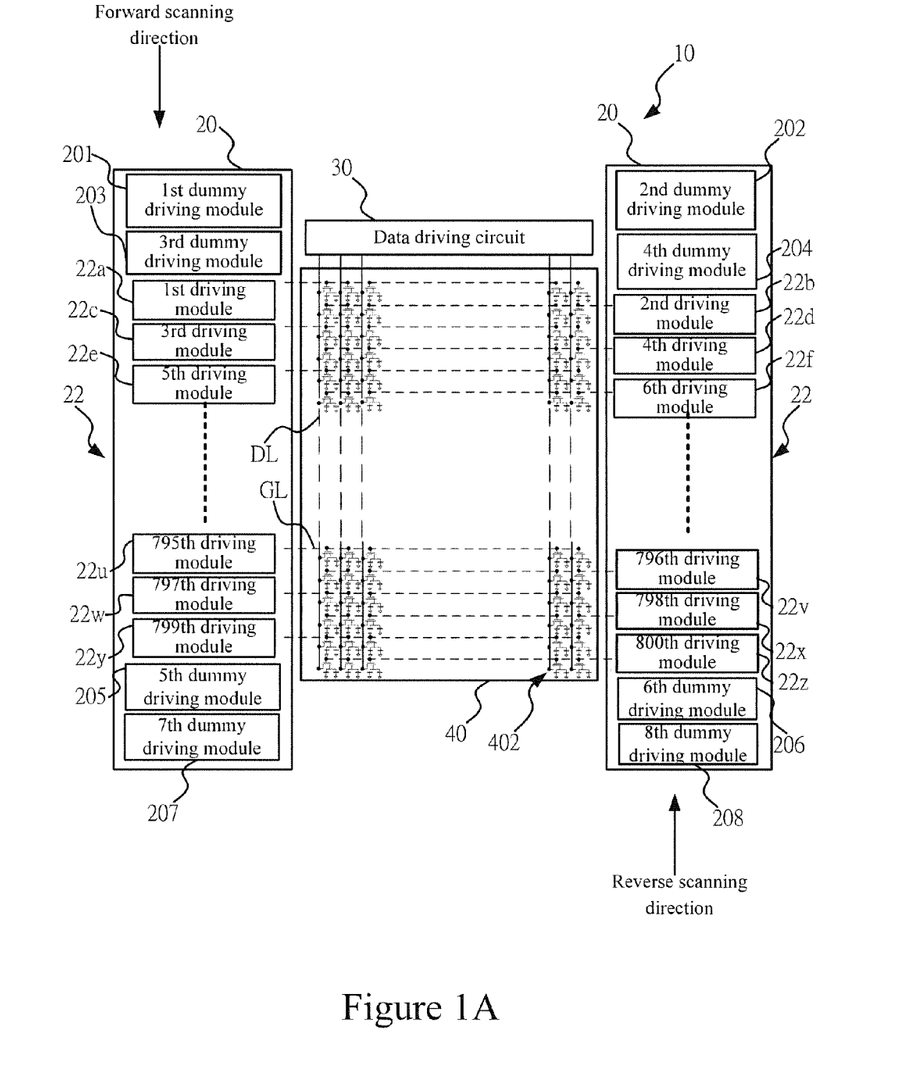
FIG. 1A shows a block diagram of the display device according an embodiment of the present invention.

FIG. 1A shows a block diagram of the display device according an embodiment of the present invention. As shown in the figure, the display device 10 comprises a bidirectional scanning driving circuit 20, a data driving circuit 30, and a display panel 40. The bidirectional scanning driving circuit 20 comprises a plurality of dummy driving modules and a plurality of driving modules. For example, according to the present embodiment, the dummy driving modules include a first dummy driving module 201, a second dummy driving module 202, a third dummy driving module 203, a fourth dummy driving module 204, a fifth dummy driving module 205, a sixth dummy driving module 206, a seventh dummy driving module 207, and an eighth dummy driving module 208. Besides, the display device 10 has 800 scan lines. Thereby, the number of the driving modules 22 is 800. Moreover, the display panel 40 includes a plurality of pixel structures 402.

The display panel 40 includes a plurality of scan lines GL and a plurality of data lines DL disposed thereon. The plurality of driving module 22 of the bidirectional scanning driving circuit 20 are coupled to the plurality of pixel structures 402 via the plurality of scan lines GL. The data driving circuit 30 is coupled to the plurality of pixel structures 402 via the plurality of data lines DL. According to the present embodiment, the scanning driving circuit 20 is disposed on both sides of the display panel 40. Nonetheless, the present invention is not limited to this embodiment; the scanning driving circuit 20 can be further integrated on one side of the display panel 40. In addition, the plurality of driving modules 22 according to the present embodiment are arranged in odd series on the left side and in even series on the right side of the display panel 40. For example, a first driving module 22a, a third driving module 22c, a fifth driving module 22e to a 795th driving module 22u, a 797th driving module 22w, and a 799th driving module 22y are arranged on the left side of the display panel 40 sequentially, while a second driving module 22b, a fourth driving module 22d, a sixth driving module 22f to a 796th driving module 22v, a 798th driving module 22x, and an 800th driving module 22z are arranged on the right side of the display panel 40 sequentially.

The display device 40 uses the plurality of driving module 22 to output scan signals sequentially to the transistors of the plurality of pixel structures 402 for driving and controlling the plurality of pixel structures 402 to receive the data signals outputted by the data driving circuit 30. The n-th stage driving module 22 needs to connect electrically with the (n−2)th stage and the (n+2)th stage driving modules, respectively. Nevertheless, the first and final two stages of driving modules 22 on both sides are located on the edges. Thereby, a first dummy driving module 201, a second dummy driving module 202, a third dummy driving module 203, a fourth dummy driving module 204, a fifth dummy driving module 205, a sixth dummy driving module 206, a seventh dummy driving module 207, and an eighth dummy driving module 208 are disposed selectively on both sides.

The first and third dummy driving modules 201, 203 correspond to the first, third and fifth driving modules 22a, 22c, 22e. The second and fourth dummy driving modules 202, 204 correspond to the second, fourth and sixth driving modules 22b, 22d, 22f. The fifth and seventh dummy driving modules 205, 207 correspond to the 796th, 797th and 799th driving modules 22u, 22w, 22y. The sixth and eighth dummy driving modules 206, 208 correspond to the 796th, 798th and 800th driving modules 22v, 22x, 22z. Because the n-th stage driving module 22 according to the present invention receives the output signal of the (n−2)th stage driving module and transmits the output signal to the (n+2)th stage driving module, the first and third driving modules 22a, 22c need to provide scan signals according to the output signals of the first and third dummy driving modules 201, 203, respectively. The first and third dummy driving modules 201, 203 receive external input signals, respectively, for outputting the input signals required by the first and third driving modules 22a, 22c correspondingly. Signal transmission for the pairs of the second and fourth dummy driving modules 202, 204, the fifth and seventh dummy driving modules 205, 207, and the sixth and eighth dummy driving modules 206, 208 is similar to the case for the first and third dummy driving modules 201, 203.

The display device 10 according to the present invention provides bidirectional scanning. This means that the order for outputting scan signals by the bidirectional scanning driving circuit 20 can be forward, so that the plurality of driving modules 22 can output scan signals sequentially from top to bottom, such as producing scan signals sequentially from the first driving module 22a to the 800th driving module 22z. The order can be reversed as well, so that the plurality of driving modules 22 can output scan signals sequentially from bottom to top, such as producing and outputting scan signals sequentially from the 800th driving module 22z to the first driving module 22a.

Figure 1B:
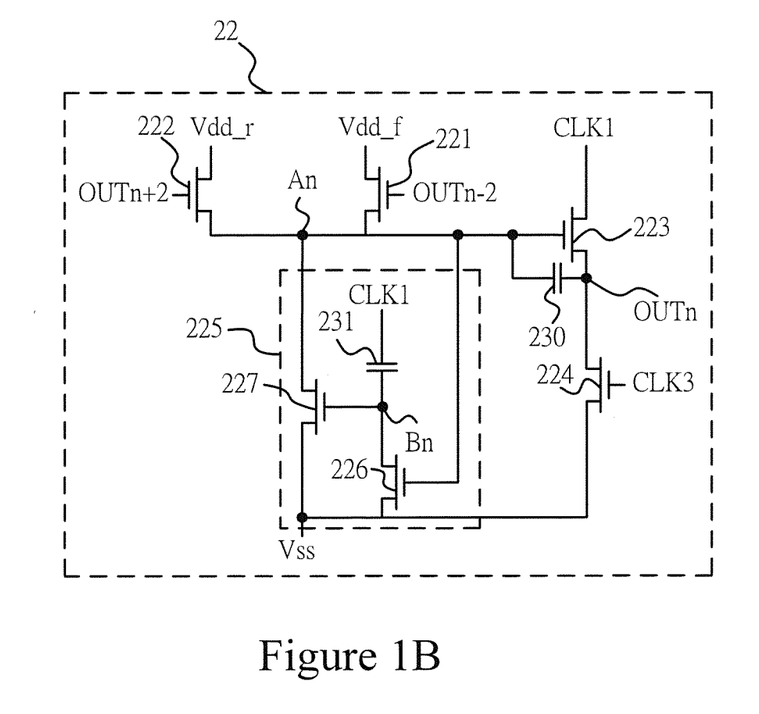
FIG. 1B shows a block diagram of the driving module according an embodiment of the present invention.

FIG. 1B shows a block diagram of the driving module according an embodiment of the present invention. As shown in the figure, the driving module 22 according to the present invention is a driving circuit applied to a display panel. The bidirectional scanning driving circuit comprises a plurality of driving modules 22 for producing a plurality of scan signals and scanning the plurality of pixel structures of the display panel. The driving module 22 comprises a forward input unit 221, a reverse input unit 222, and an output unit 223. In addition, the driving module 22 further comprises a first noise free unit 224, a second noise free unit 225, and a first capacitor 230. The second noise free unit 225 comprises a first transistor 226, a second transistor 227, and a second capacitor 231.

For the n-th stage driving module 22, a first terminal of its forward input unit 221 is coupled to a front output OUTn−2 of any driving module 22 lower than or equal to the (n−2)th stage. For example, in FIG. 1A, the output of the first dummy driving module 201 is coupled to the first terminal of the forward input unit of the first driving module 22a; the output of the third dummy driving module 203 is coupled to the first terminal of the forward input unit of the third driving module 22c; and the output of the first driving module 22a is coupled to the first terminal of the forward input unit of the fifth driving module 22e. A second terminal of the forward input unit 221 receives a first input voltage Vdd_f. A first terminal of the reverse input unit 222 is coupled to a back output OUTn+2 of any driving module 22 higher than or equal to the (n+2)th stage. A second terminal of the reverse input unit 222 receives the second input voltage Vdd_r. A third terminal of the forward input unit 221 and a third terminal of the reverse input unit 222 are coupled to a control node An of the output unit 223, respectively. A first terminal of the output unit 223 is coupled to the control node An. A second terminal of the output unit 223 receives a first clock signal CLK1. A third terminal of the output unit 223 is coupled to an output OUTn via the first capacitor 230. A first terminal of the first noise free unit 224 receives a third clock signal CLK3. A second terminal of the first noise free unit 224 is coupled to the output OUTn. A third terminal of the first noise free unit 224 is coupled to a reference voltage Vss. The first capacitor 230 is coupled between the control node An and the output OUTn. In other words, the first terminal of the first capacitor 230 is coupled to the control node An; the second terminal of the first capacitor 230 is coupled to the output OUTn. The first noise free unit 224 according to the present embodiment receives the third clock signal CLK3. Nonetheless, the present invention is not limited to the embodiment. The first noise free unit 224 can receive a second clock signal CLK2 or a fourth clock signal CLK4 instead.

The second noise free unit 225 is coupled to the control node An. Thereby, the second noise free unit 225 is coupled to the forward input unit 221, the reverse input unit 222, and the output unit 223. Besides, the second noise free unit 225 also receives the first clock signal CLK1. The second capacitor 231 receives the first clock signal CLK1 and is coupled to the first and second transistors 226, 227. The first terminal of the first transistor 226 and the first terminal of the second transistor 227 are coupled to the control node An, respectively. The second terminal of the first transistor 226 and the second terminal of the second transistor 227 are coupled to the reference voltage Vss, respectively.

Figure 2A:
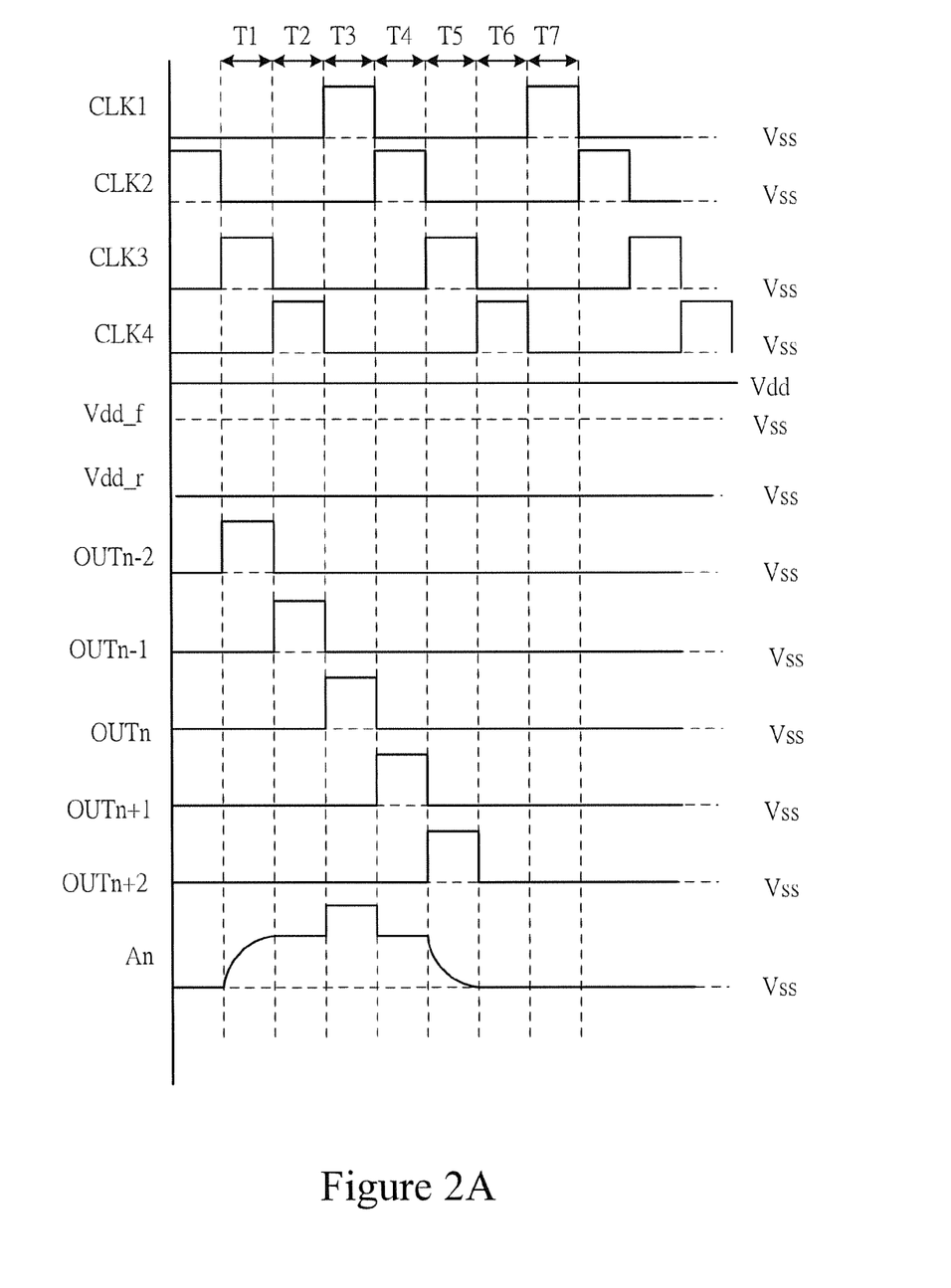
FIG. 2A shows waveforms of the driving signals during forward scanning according an embodiment of the present invention.

The forward input unit 221 receives a front forward scan signal via the front output OUTn−2 for charging or discharging the control node An according to the first input voltage Vdd_f and the front forward scan signal. In addition, when the forward input unit 221 charges the output unit 223 according to the first input voltage Vdd_f and the front forward scan signal, the output unit 223 produces a forward scan signal to the output OUTn according to the received first clock signal CLK1. When the forward input unit 221 charges the output unit 223 for making the output unit 223 output the forward scan signal, the reverse input unit 222 discharges the control node An of the output unit 223 after the output unit 223 produces the forward scan signal for a while, particularly, for a clock cycle time. For example, as shown in FIG. 2A, when the output signal corresponding to the output OUTn is generated at the clock cycle time T3, the reverse input unit 222 discharges the control node An at the clock cycle time T5. Hence, the voltage curve decays at the control node An. The driving module 22 according to the present embodiment achieves forward scanning mode by means of the operations described above.

Figure 2B:
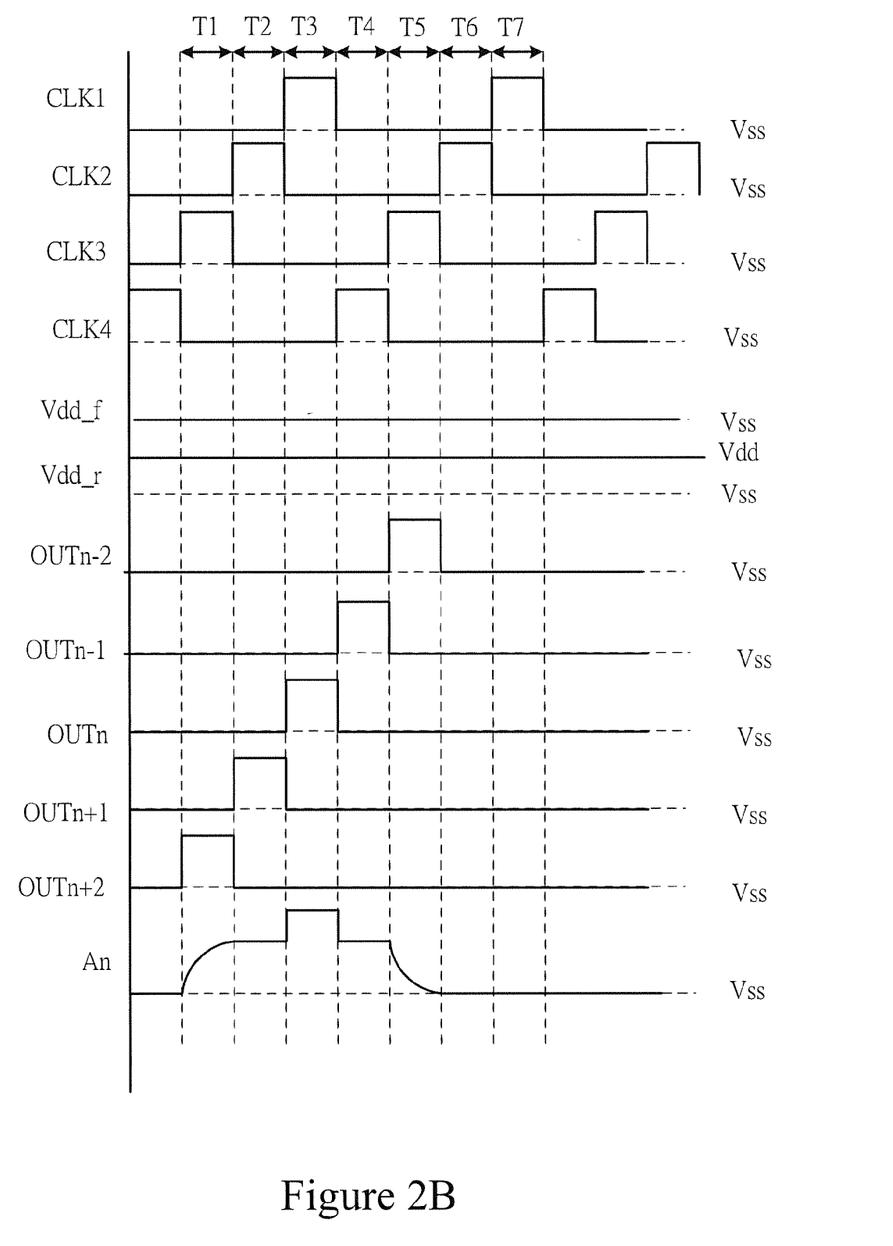
FIG. 2B shows waveforms of the driving signals during reverse scanning according an embodiment of the present invention.

The reverse input unit 222 charges or discharges the control node An according to the second input voltage Vdd_r and a back reverse scan signal. When the reverse input unit 222 charges the control node An of the output unit 223 according to the second input voltage Vdd_r and the back reverse scan signal, the output unit 223 produces a reverse scan signal to the output OUTn. When the reverse input unit 222 charges the output unit 223 for making the output unit 223 output the reverse scan signal, the forward input unit 221 discharges the control node An of the output unit 223 after the output unit 223 produces the reverse scan signal for a while, particularly, for a clock cycle time. For example, as shown in FIG. 2B, when the output signal corresponding to the output OUTn is generated at the clock cycle time T3, the forward input unit 221 discharges the control node An at the clock cycle time T5. The driving module 22 according to the present embodiment achieves reverse scanning mode by means of the charging and discharging operations described above.

Moreover, refer again to FIG. 1B. The first noise free unit 224 according to the present embodiment cancels the noise of the output unit 223 according to the third clock signal CLK3. Nonetheless, the present invention is not limited to the embodiment. The first noise free unit 224 can receive other clock signals for canceling the noise of the output unit 223. Namely, the first noise free unit 224 cancels the noise of the output unit 223 according to the second, the third, or the fourth clock signal CLK2, CLK3, CLK4. The second noise free unit 225 filters the noise at the control node An of the output unit 223. The second capacitor 231 produces a control level Bn according to the first clock signal CLK1. The first transistor 226 determines if the control level Bn is pulled down according to the voltage level of the control node An for further controlling the second transistor 227 to filter the noise at the control node An.

FIGS. 2A and 2B show waveforms of the driving signals during forward and reverse scanning according an embodiment of the present invention. As shown in FIG. 2A, it shows waveforms of a driving circuit in the forward scanning mode. In the forward scanning mode, the forward input unit 221 of the driving module 22 is used for charging the control node An. On the other hand, In the forward scanning mode, the reverse input unit 222 discharges the control node An of the output unit 223 after the output unit 223 produces the forward scan signal for a clock cycle time. Thereby, the first input voltage Vdd_f is high (Vdd), while the second input voltage Vdd_r is low. According to the present embodiment, the second input voltage Vdd_r is pulled down to the reference voltage Vss.

Refer to FIG. 1B altogether. While executing at the clock cycle time T1, the forward input unit 221 is turned on according to the scan signal of the front output OUTn−2 for charging the control node An. Meanwhile, the output OUTn is kept low. While executing at the clock cycle time T2, the control node An is floating. Thereby, the control node An is not charged by the forward input unit 221 any more. While executing at the clock cycle time T3, the control node An is floating. Owing to the high voltage level of the control node An, the output unit 223 is driven to receive the first clock signal CLK1 and transmit the first clock signal CLK1 to the output OUTn. Besides, the voltage level of the control node An is raised by the first capacitor 230 and thus making the output unit 223 charge the output OUTn rapidly.

While executing at the clock cycle time T4, the control node An is floating and the voltage level of first clock signal CLK1 is low. The output OUTn is discharged to the low voltage level, namely, the reference voltage Vss, via the output unit 223. While executing at the clock cycle time T5, the control node An is discharged to the low voltage level by the reverse input unit 222. The output OUTn is maintained at the low voltage level via the first noise free unit 224. While executing at the clock cycle time T6, the control node An is floating. While executing at the clock cycle time T7, the control node An will produce noise owing to the parasitic capacitor of the output unit 223. However, the second transistor 227 of the second noise free unit 225 is turned on simultaneously for pulling the voltage level of the control node An to the stable low voltage level and thus canceling the noise due to parasitic capacitor.

As shown in FIG. 2B, it shows waveforms of a driving circuit in the reverse scanning mode. The situation in FIG. 2A is the reverse of that in FIG. 2B. Thereby, it becomes that the reverse input unit 222 charges the control node An. The forward input unit 221 discharges the control node An of the output unit 223 after the output unit 223 produces the reverse scan signal for a clock cycle time. Hence, the second input voltage Vdd_r is high (Vdd), while the first input voltage Vdd_f is low. According to the present embodiment, the first input voltage Vdd_f is pulled down to the reference voltage Vss. Refer again to FIG. 2B, from the clock cycle time T1 to T7, the driving module 22 uses the reverse input unit 222 to charge the control node An instead; the forward input unit 221 is used for discharging the control node An. The rest operations are the same as those for FIG. 2A.

It is known from above that the driving module 22 according to the present invention charges the control node An via the forward and reverse input units 221, 222, respectively, for driving the output unit 223 to provide the scan signals for different scanning modes. In addition, for any scanning mode of the driving module 22 according to the present invention, the forward and reverse input units 221, 222 take turns to charge or discharge the control node An and thus simplifying the circuit. Furthermore, because the second noise free unit 225 receives the first clock signal CLK1 via the second capacitor 231, direct conduction of the voltage and current of clock signals to the reference voltage Vss is avoided, which reduced unnecessary direct-current consumption. Besides, because the plurality of driving modules 22 operate according to at least three clock signals and the plurality of driving modules 22 receive the clock signals during non-operating time, the control node An of the plurality of driving modules 22 tends to be influenced by parasitic capacitor of the output unit 223 and thus leading to generate noise. Thereby, by using the second noise free unit 225, the noise at the control node is canceled. Accordingly, unnecessary power consumption of the output unit 223 during non-operating time can be prevented.

Figure 3:
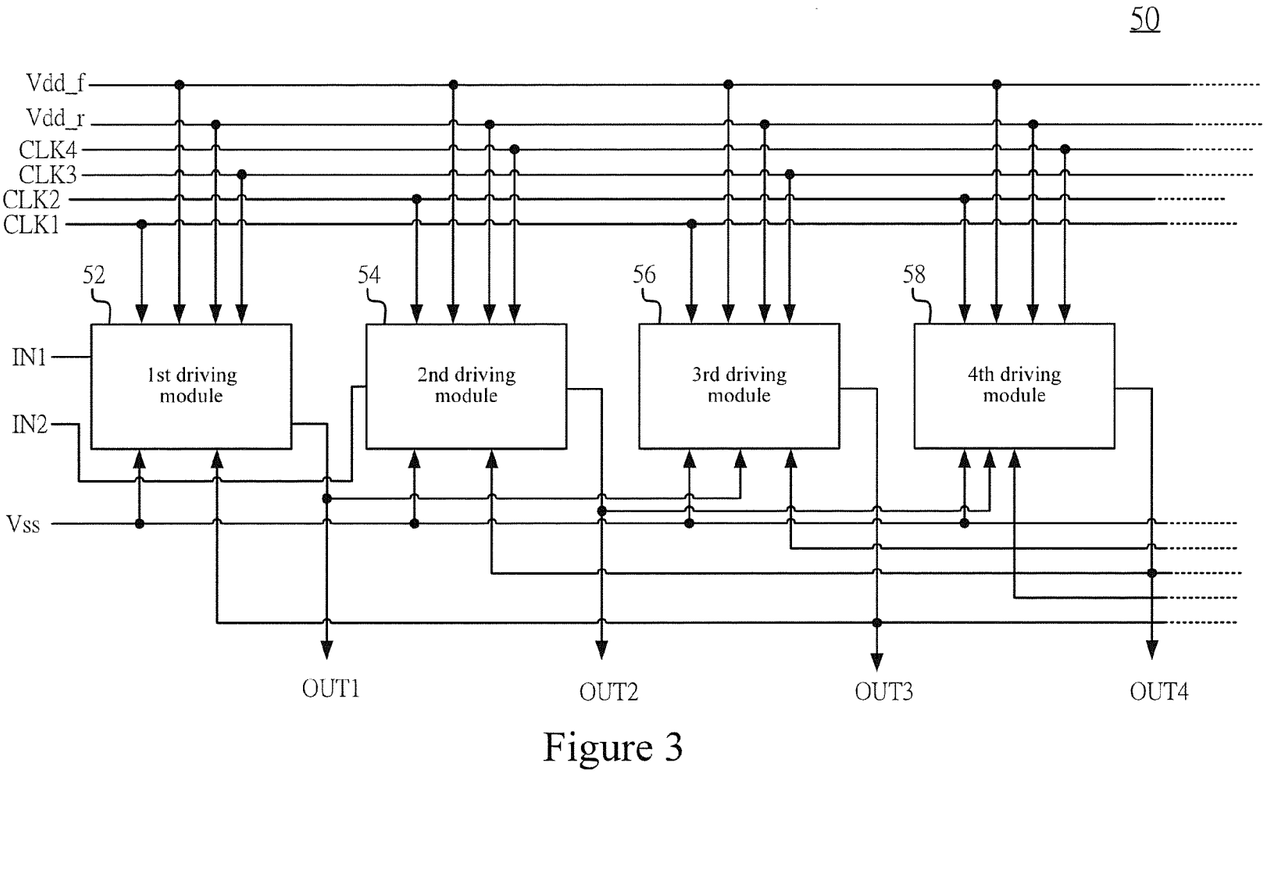
FIG. 3 shows a block diagram of the bidirectional scanning driving circuit according an embodiment of the present invention.

FIG. 3 shows a block diagram of the bidirectional scanning driving circuit according an embodiment of the present invention. As shown in the figure, the driving circuit 50 according to the present invention comprises a plurality of driving modules. According to the present embodiment, a first driving module 52, a second driving module 54, a third driving module 56, and a fourth module 58 are uses as an example. The detailed circuits of the first, the second, the third, and the fourth driving circuits 52, 54, 56, 58 are the same as the driving module 22 according to the previous embodiment. Because there exists no (n−2)th stage driving module for the first and the second driving modules 52, 54, the first and the second driving modules 52, 54 receive a first input signal IN1 and a second input signal IN2, respectively. The first and the second driving modules 52, 54 operate like the first and the third dummy driving modules 201, 203 shown in FIGS. 1A and 1B. They provide output signals to the (n+2)th stage driving module only but not transmitting the output signal to the scan line for scanning the pixel structures. The first and the third driving modules 52, 56 receive the first clock signal CLK1 and the third clock signal CLK3; the second and the fourth driving modules 54, 58 receive the second clock signal CLK2 and the fourth clock signal CLK4. In addition, the first, the second, the third, and the fourth driving modules 52, 54, 56, 58 are all coupled to the first input voltage Vdd_f and the second input voltage Vdd_r as well as to the reference voltage Vss, which is equivalent to the low voltage level, for example, 1V, of the circuit.

The first driving module 52 outputs and transmits a first output signal OUT1 to the third driving module 56. The second driving module 54 outputs and transmits a second output signal OUT2 to the fourth driving module 58. The third driving module 56 outputs and transmits a third output signal OUT3 to the (n+2)th stage driving module and to the (n−2)th stage driving module. Namely, the third output signal OUT3 is transmitted to the fifth driving module (not shown in the figure) and the first driving module 52. The fourth driving module 58 outputs and transmits a fourth output signal OUT4 to the (n+2)th stage driving module and to the (n−2)th stage driving module. Namely, the fourth output signal OUT4 is transmitted to the sixth driving module (not shown in the figure) and the second driving module 54. The first output signal OUT1, the second output signal OUT2, the third output signal OUT3, and the fourth output signal OUT4 are scan signals.

Moreover, the present embodiment takes four driving modules for example. Nonetheless, the present invention is not limited to the embodiment. At least three driving modules can be used for providing the scan signals for forward and reverse scanning.

To sum up, the present invention provides a bidirectional driving circuit, which uses the forward input unit and the reverse input unit for charging or discharging the control node in the forward or reverse scanning mode, respectively. Thereby, when the forward input unit is charging the control node, the output unit is driven to produce the forward scan signal; when the reserve input unit is charging the control node, the output unit is driven to produce the reverse scan signal. Hence, the present invention provides a bidirectional driving circuit. Besides, in the forward scanning mode, the forward input unit charges the control node and the reverse input unit discharges the control node; in the reverse scanning mode, the reverse input unit charges the control node and the forward input unit discharges the control node. Thereby, the charging and discharging mechanisms for the control node as well as the circuit layout are simplified.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A bidirectional scanning driving circuit, comprising a plurality of driving modules having N stages, said plurality of driving modules receiving a plurality of clock signals, a first input voltage, and a second input voltage, respectively, said plurality of driving modules producing and outputting a plurality of scan signals to a display panel sequentially, and the n-th stage driving module comprising:
   an output unit, receiving a first clock signal of said plurality of clock signals;
   a forward input unit, coupled to said output unit, receiving said first input voltage and a front forward scan signal of any of said plurality of driving modules lower than or equal to (n−2)th stage, and said forward input unit charging or discharging a control node of said output unit according to said first input voltage and said front forward scan signal; and
   a reverse input unit, coupled to said output unit, receiving said second input voltage and a back reverse scan signal of any of said plurality of driving modules higher than or equal to (n+2)th stage, and said reverse input unit charging or discharging said control node of said output unit according to said second input voltage and said back reverse scan signal;
   where said forward input unit charges said output unit according to said first input voltage and said front forward scan signal for producing a forward scan signal, and said reverse input unit charges said output unit according to said second input voltage and said back reverse scan signal for producing a reverse scan signal.

2. The bidirectional scanning driving circuit of claim 1, wherein said plurality of driving modules further comprise, respectively, a noise free unit, coupled to said forward input unit, said reverse input unit, and said output unit; the noise free unit receiving said first clock signal, and filtering the noise at said control node of said output unit.

3. The bidirectional scanning driving circuit of claim 2, wherein said noise free unit comprises:
   a capacitor, having a first terminal receiving said first clock signal, and producing a control level according to said first clock signal;
   a first transistor, having a first terminal coupled to a second terminal of said capacitor, having a second terminal coupled to said forward input unit, said reverse input unit, and said control node of said output unit, and having a third terminal coupled to a reference voltage; and
   a second transistor, having a first terminal coupled to said forward input unit, said reverse input unit, and said control node of said output unit, having a second terminal coupled to said first terminal of said first transistor and said second terminal of said capacitor, and having a third terminal coupled to said reference voltage.

4. The bidirectional scanning driving circuit of claim 1, wherein said plurality of clock signal comprises said first clock signal, a second clock signal, a third clock signal, a fourth clock signal generated sequentially and cyclically.

5. The bidirectional scanning driving circuit of claim 1, wherein said plurality of driving modules further comprise, respectively, a noise free unit, having a first terminal coupled to said output unit; the noise free unit having a second terminal receiving a second clock signal, a third clock signal, or a fourth clock signal; the noise free unit having a third terminal receiving a reference voltage level; and the noise free unit canceling the noise of said output unit according to said second clock signal, said third clock signal, or said fourth clock signal.

6. The bidirectional scanning driving circuit of claim 1, wherein said plurality of driving modules further comprise, respectively, a capacitor, having a first terminal coupled to said forward input unit, said reverse input unit, and said control node of said output unit; and the capacitor having a second terminal coupled to a first terminal of said output unit.

7. The bidirectional scanning driving circuit of claim 1, wherein when said forward input unit charges said output unit for making said output unit output said forward scan signal, said reverse input unit discharges said control node after said output unit produces said forward scan signal for a while.

8. The bidirectional scanning driving circuit of claim 7, wherein said reverse input unit discharges said control node after said output unit produces said forward scan signal for a clock cycle time.

9. The bidirectional scanning driving circuit of claim 1, wherein when said reverse input unit charges said output unit for making said output unit output said reverse scan signal, said forward input unit discharges said control node after said output unit produces said reverse scan signal for a while.

10. The bidirectional scanning driving circuit of claim 9, wherein said forward input unit discharges said control node after said output unit produces said reverse scan signal for a clock cycle time.

\* \* \* \* \*